(12) United States Patent
Kumagai

(10) Patent No.: US 7,981,484 B2
(45) Date of Patent: Jul. 19, 2011

(54) DISPLAY DEVICE AND METHOD OF MANUFACTURING THE SAME

(75) Inventor: Minoru Kumagai, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 1067 days.

(21) Appl. No.: 11/523,400

(22) Filed: Sep. 19, 2006

(65) Prior Publication Data

US 2007/0071885 A1    Mar. 29, 2007

(30) Foreign Application Priority Data

Sep. 29, 2005    (JP) .................................. 2005-283958

(51) Int. Cl.
*H01L 51/56* (2006.01)
*B29C 71/02* (2006.01)
*B05D 5/06* (2006.01)

(52) U.S. Cl. ......................................... 427/541; 427/66
(58) Field of Classification Search ................... 427/541, 427/66

See application file for complete search history.

(56) References Cited

U.S. PATENT DOCUMENTS

| | | | |
|---|---|---|---|
| 7,291,970 B2 | 11/2007 | Kuwabara | |
| 7,294,856 B2 | 11/2007 | Ito et al. | |
| 2003/0143339 A1* | 7/2003 | Kobayashi | ..................... 427/558 |
| 2004/0119403 A1 | 6/2004 | McCormick et al. | |
| 2005/0079277 A1 | 4/2005 | Takashima et al. | |
| 2005/0112341 A1 | 5/2005 | Ito et al. | |
| 2006/0098521 A1 | 5/2006 | Shimoda et al. | |
| 2006/0220532 A1 | 10/2006 | Tanabe et al. | |
| 2007/0019032 A1 | 1/2007 | Maekawa et al. | |
| 2007/0057627 A1* | 3/2007 | Kidu et al. | ..................... 313/503 |
| 2007/0264899 A1 | 11/2007 | Kumagai | |
| 2008/0030118 A1 | 2/2008 | Ham | |
| 2008/0030119 A1 | 2/2008 | Ito et al. | |
| 2009/0070995 A1 | 3/2009 | Kumagai | |

FOREIGN PATENT DOCUMENTS

| | | |
|---|---|---|
| JP | 8-011504 A | 1/1996 |
| JP | 8-015504 A | 1/1996 |
| JP | 11-192450 A | 7/1999 |
| JP | 2001-076881 A | 3/2001 |
| JP | 2003-203766 A | 7/2003 |

(Continued)

OTHER PUBLICATIONS

Chinese Office Action (and English translation thereof) dated Dec. 14, 2007, issued in a counterpart Chinese Application.

(Continued)

*Primary Examiner* — Brian P Mruk
(74) *Attorney, Agent, or Firm* — Holtz, Holtz, Goodman & Chick, PC

(57) ABSTRACT

An object of the present invention is to provide a display device that has carrier transport layer with relatively uniform film thickness, at pixel forming region of display pixel, and a manufacturing thereof. A manufacturing method of a display device provided with a luminescent element that has a carrier transport layer includes a liquid repellent film forming step to form a liquid repellent film on a surface of a plurality of barrier walls provided on a substrate; a coating step to coat a carrier transport material containing acidic solution that contains carrier transport layer material on a pixel electrode arranged in between the plurality of barrier walls; and a drying step to dry the carrier transport material containing acidic solution under inert gas atmosphere.

14 Claims, 11 Drawing Sheets

FOREIGN PATENT DOCUMENTS

| | | |
|---|---|---|
| JP | 2003-224349 A | 8/2003 |
| JP | 2003-257656 A | 9/2003 |
| JP | 2003-347063 A | 12/2003 |
| JP | 2004-106320 A | 4/2004 |
| JP | 2005-038634 A | 2/2005 |
| JP | 2005-116313 A | 4/2005 |
| JP | 2005-174906 A | 6/2005 |
| JP | 2005-251768 A | 9/2005 |
| JP | 2006-098977 A | 4/2006 |
| JP | 2006-119618 A | 5/2006 |
| JP | 2006-337935 A | 12/2006 |
| JP | 2007-111646 A | 5/2007 |
| KR | 2005-0053640 A | 6/2005 |
| WO | WO 2004/061992 A1 | 7/2004 |

OTHER PUBLICATIONS

Japanese Office Action dated Apr. 28, 2010 and English translation thereof in counterpart Japanese Application No. 2005-283958.

Japanese Office Action dated Apr. 28, 2008 and English translation thereof issued in Japanese Application No. 2006-131002, which is a Japanese counterpart of related U.S. Appl. No. 11/801,696.

Japanese Office Action dated Apr. 28, 2008 and English translation thereof issued in Japanese Application No. 2006-152964, which is a Japanese counterpart of related U.S. Appl. No. 11/801,696.

Korean Office Action dated Apr. 18, 2008 and English translation thereof issued in Korean Application No. 2007-0045690, which is a Korean counterpart of related U.S. Appl. No. 11/801,696.

U.S. Appl. No. 12/211,230; First Named Inventor: Minoru Kumagai; Title: Manufacturing Method of Display Device; filed Sep. 16, 2008.

U.S. Appl. No. 11/801,696; First Named Inventor: Minoru Kumagai; Title: "Display Device and Manufacturing Method Thereof"; filed May 10, 2007.

Japanese Office Action dated Oct. 15, 2009 and English translation thereof issued in Japanese Application No. 2007-240627, which is a Japanese counterpart of related U.S. Appl. No. 12/211,230.

Taiwanese Office Action dated Jul. 19, 2010 and English translation thereof, issued in counterpart Taiwanese Application No. 095135086.

* cited by examiner

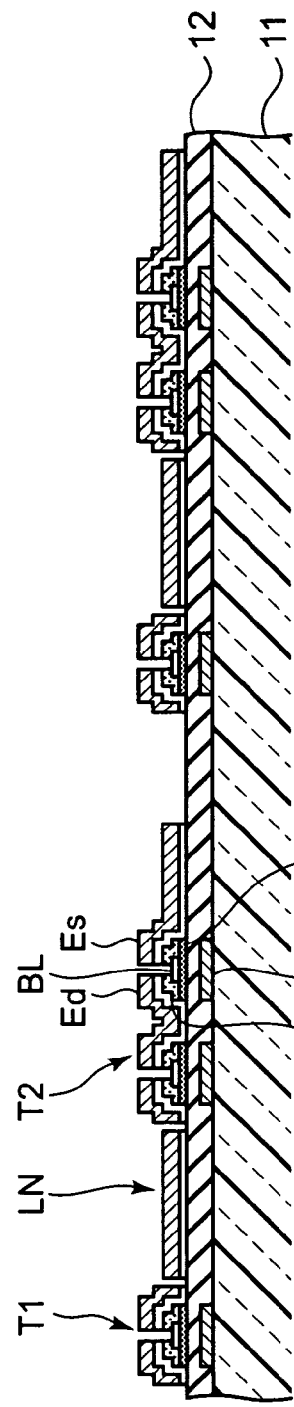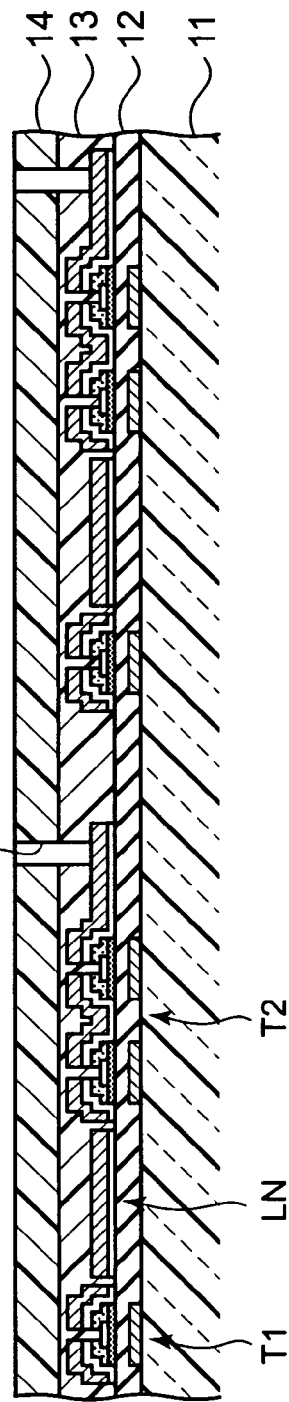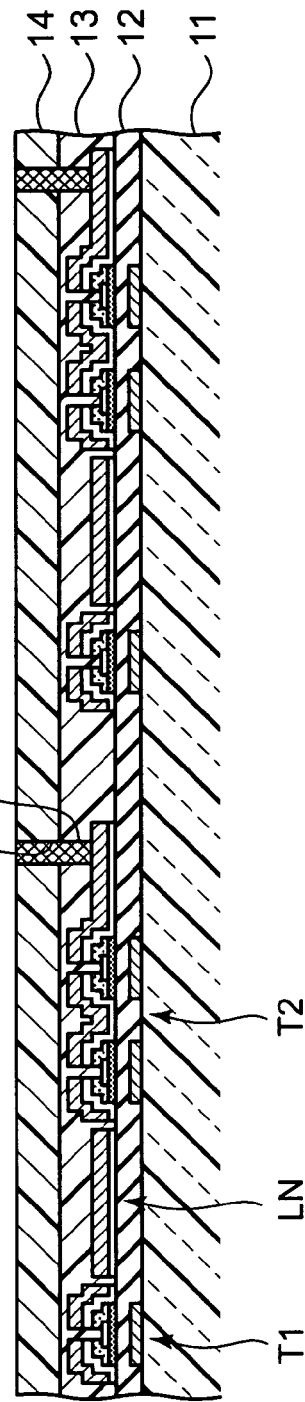

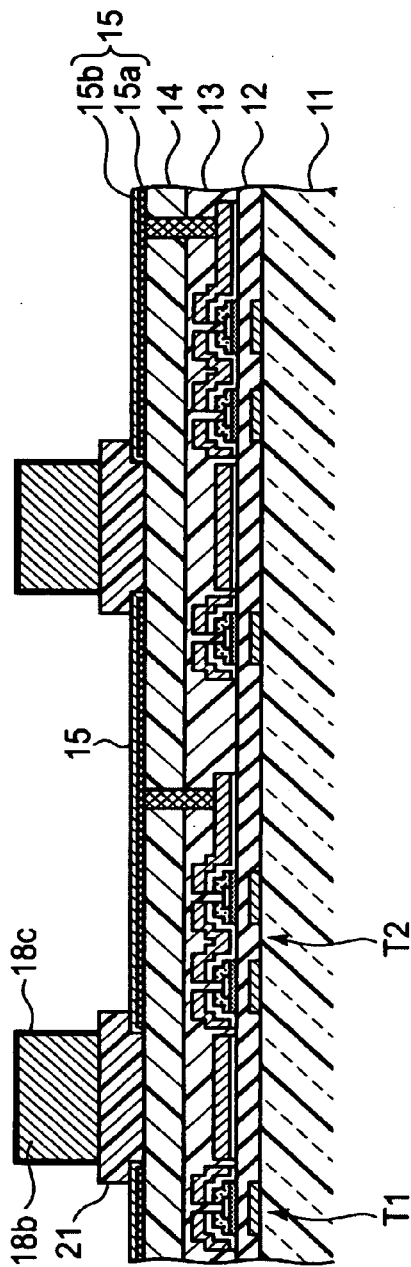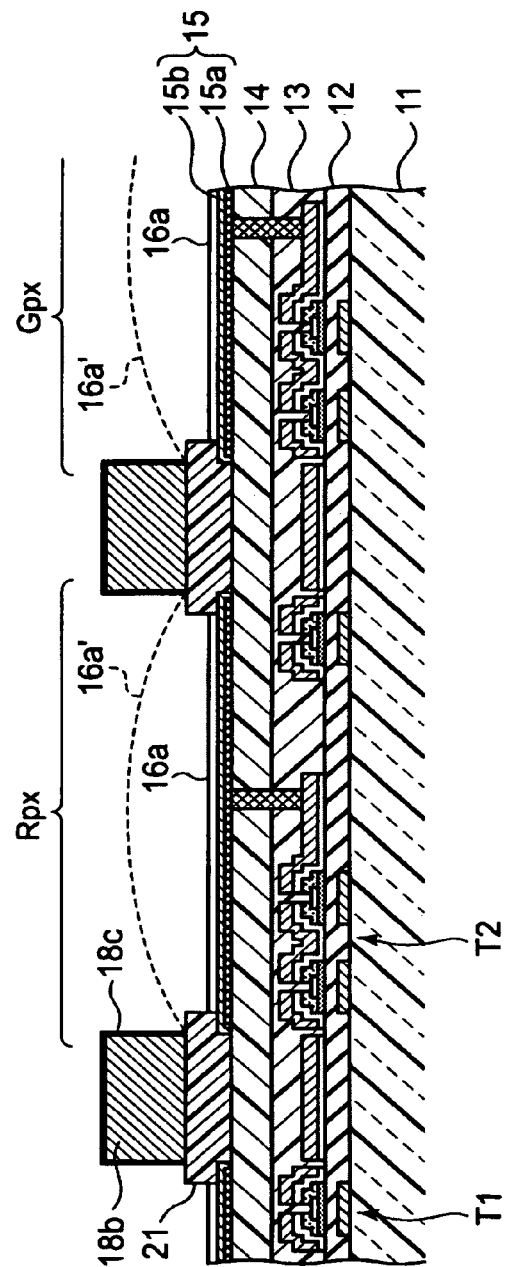
FIG. 5A
FIG. 5B

FLUORIDE TYPE TRIAZINE DITHIOL DERIVATIVE

DISPLAY DEVICE AND METHOD OF MANUFACTURING THE SAME

CROSS-REFERENCE TO RELATED APPLICATIONS

This application is based upon and claims the benefit of priority from the prior Japanese Patent Application No. 2005-283958, filed on Sep. 29, 2005, and the entire contents of which are incorporated herein by reference.

BACKGROUND OF THE INVENTION

1. Field of the Invention

The present invention relates to a display device and method of manufacturing the same. Particularly, the present invention relates to a display device provided with display panel, that has a plurality of organic electro luminescent element arranged as a display pixel.

2. Background of the Invention

Recently, as a new generation display device that follows liquid crystal display device (LCD), that is heavily used as monitor and display for personal computer, image apparatus, mobile information apparatus, and the like, research and development is made actively on display (display device) provided with display panel of luminescent element type, that have self luminescent element such as organic electro luminescent element (hereinafter abbreviated as "organic EL element"), luminescent diode (LED), and the like, in two dimensional arrangement.

In particular, concerning a luminescent element display panel of active matrix driving type, when compared to liquid crystal display device, display response speed is fast, and there is no dependency on viewing angle. In addition, high luminance and high contrast, as well as higher resolution of image quality and the like can be achieved. Further, since it does not need back light like the liquid crystal display device, more thinned and light-weighed display panel can be achieved, thus luminescent element display panel of active matrix driving type holds an extremely strong position.

Here brief description is given on organic EL element as an example of self luminescent element applied to luminescent element type display.

FIG. 10 is a schematic cross sectional view showing one example of structure of organic EL element.

As shown in FIG. 10, the organic EL element is structured by stacking anode electrode (positive electrode) 112, organic EL layer 113 comprising organic compound (organic material) and the like, and cathode electrode (negative electrode) 114 in this order on one side (upper side in figure) of an insulating substrate 111 such as glass substrate, schematically.

The organic EL layer 113 is structured with, for example, a positive hole transport layer (positive hole injection layer) 113a comprising positive hole transport material (positive hole injection layer forming material), and an electron transporting light emitting layer (light emitting layer) 113b comprising electron transporting light emitting material. Here, as for positive hole transport material and electron transporting light emitting material applied to the organic EL layer 113 (positive hole transport layer 113a and electron transporting light emitting layer 113b), various kinds of organic materials of low molecular and high molecular organic materials are known.

Here, in general, when using low molecular organic material, light emitting efficiency at the organic EL layer is relatively high. However, since deposition method is used in manufacturing process, when forming film only onto the anode electrode within pixel forming region selectively, low molecular material is applied also on a mask surface that is provided to prevent deposition of low molecular material on region other than the afore-mentioned anode electrode. Therefore, there is a problem that material loss during manufacturing is large, and that manufacturing process is not efficient.

On the other hand, when using high molecular organic material, since droplet discharge method (what is called ink jet method) as a wet coating method and the like can be used, liquid droplet can be selectively coated on anode electrode within pixel forming region, thus organic EL layer (positive hole transport layer and electron transporting light emitting layer) can be formed efficiently.

Here, a brief description is given on manufacturing process of organic EL element using high molecular organic material.

FIG. 11 and FIG. 12 are cross sectional view of process flow concerning one example of manufacturing process of display panel (organic EL element) within conventional technique. Here, for convenience of explanation, a case in which only organic EL element is formed on insulating substrate is shown. In addition, the same reference number is used for description concerning the same structure with the afore-mentioned organic EL element described in FIG. 10.

One example of manufacturing process of organic EL element is, first of all as shown in FIG. 11A, to form anode electrode (positive electrode) 112 for each region that is to be formed with each display pixel (pixel forming region) Apx, wherein the pixel forming region Apx is on one side (upper side in figure) of insulating substrate 111 such as glass substrate and the like. Subsequently, as shown in FIG. 11B, barrier wall (bank) 121 comprising insulating material and the like is formed in boundary region of adjacent display pixel. Here, in the pixel forming region Apx surrounded by the barrier wall 121, the afore-mentioned anode electrode 112 is exposed.

Next, as shown in FIG. 11C, by irradiating ultraviolet ray on a surface of the insulating substrate 111 under oxygen gas atmosphere, oxygen radical is generated, organic matter on the surface of the anode electrode 112 is removed by decomposition making the surface of the anode electrode 112 hydrophilic, and radical is also generated on the surface of the barrier wall 121 making the surface of the barrier wall 121 lyophilic.

Next, by irradiating ultraviolet ray under fluoride compound gas atmosphere, to the insulating substrate 111 processed with the aforementioned lyophilic property applying processing, fluorine is bonded on the surface of the barrier wall 121 and made liquid repellent (or water repellent). In contrast, surface of the anode electrode (ITO) keeps 112 lyophilic property.

Next, as shown in FIG. 11D, by using an ink jet device, liquid material (first solution) HMC, which is a positive hole transport material comprising high molecular organic material dispersed or dissolved in solvent, is discharged from ink head IHH in droplet and is coated on the anode electrode 112 having lyophilic property. Subsequently, by conducting drying processing, as shown in FIG. 11E, positive hole transport material is fixed on the anode electrode 112 and thus positive hole transport layer 113a is formed.

Next, in a similar manner, as shown in FIG. 11F, liquid material (second solution) EMC, which is an electron transporting light emitting material comprising high molecular organic material dispersed or dissolved in solvent, is discharged from ink head IHE in droplet and is coated on the positive hole transport layer 113a. Subsequently, by conducting drying processing, as shown in FIG. 12A, electron transporting light emitting material is fixed and thus electron transporting light emitting layer 113b is formed. Here, in coating processing of the liquid material HMC comprising the positive hole transport material and liquid material EMC comprising electron transporting light emitting material, since the surface of the barrier wall 121 has water repellency, even in a case where liquid droplets of liquid materials HMC and EMC land on the barrier wall 121, they are repelled. Thus, liquid materials HMC and EMC are coated only on lyophilic region on the anode electrode 112 within each pixel forming region Apx (that is, organic EL element forming region Ael).

Next, as shown in FIG. 12B, cathode electrode (negative electrode) 114 comprising a shared electrode is formed so as to face the anode electrode 112 by intermediary of the organic EL layer 113 (positive hole transport layer 113a and electron transporting light emitting layer 113b) within each pixel forming region Apx. Subsequently, as shown in FIG. 12C, protective insulating film and sealing resin layer 115 are formed on the insulating substrate 111 including the cathode electrode 114, sealing substrate 116 is attached, and thus organic EL element (organic EL display panel) is obtained.

Such manufacturing method of organic EL element is described in detail in Japanese Patent Application (Laid Open) No. 2003-257656.

Concerning organic EL element having such element structure, as shown in FIG. 10, by applying positive voltage to anode electrode 112 and negative voltage to cathode electrode 114 from direct-current voltage source 115, light hυ (excitation light) is emitted according to energy generated when hole injected into the positive hole transport layer 113a and electron injected into the electron transporting light emitting layer 113b bind again in the organic EL layer 113.

Here, this light hυ can be emitted in arbitrary direction of one side (upper side in figure) or the other side (lower side in figure) of the insulating substrate 111, by forming anode electrode 112 and cathode electrode 114 with electrode materials having transparent or opaque (and light reflecting) properties, respectively. Here, emission intensity of the light hυ is determined according to amount of current that flow between anode electrode 112 and cathode electrode 114.

In the afore-mentioned manufacturing method of display panel (organic EL element), periphery of anode electrode 112 of each display pixel (pixel forming region Apx) is surrounded by barrier wall 121, and after liquid which becomes carrier transport layer material is coated in between the barrier wall 121 as partition, it is dried to form carrier transport layer (for example, the positive hole transport layer 113a and electron transporting light emitting layer 113b). The liquid which becomes carrier transport layer material, that is coated as above, tends to aggregate around periphery of the anode electrode adjacent to the barrier wall due to surface energy. As a result, carrier transport layer in the center of anode electrode becomes relatively thin, and problem arises in that thickness of film becomes uneven. Therefore, approach to form film of carrier transport layer on anode electrode uniformly, by forming film that shows liquid repellency on the surface of barrier wall is made. However, when liquid that becomes carrier transport layer material is dried by heating in the atmosphere, the film that shows liquid repellency degrades, thus it was difficult to make carrier transport layer as uniform film. Here, carrier transport layer is a layer that transport carrier of electron or positive hole when forward bias is applied, and may include light emitting region where electron and positive hole bind again.

Therefore, concerning the afore-mentioned problem, an object of the present invention is to provide display device with carrier transport layer of relatively uniform film thickness, formed in pixel forming region of display pixel, and its manufacturing method.

The present invention, concerning a manufacturing method of a display device provided with a luminescent element that has a carrier transport layer, comprises:

a liquid repellent film forming step to form a liquid repellent film on a surface of a plurality of barrier walls provided on a substrate;

a coating step to coat a carrier transport material containing acidic solution that contains carrier transport layer material on a pixel electrode arranged in between the plurality of barrier walls; and a drying step to dry the carrier transport material containing acidic solution under inert gas atmosphere.

It is especially effective in a case where the liquid repellent film has a property that liquid repellency degrades under atmosphere containing oxygen.

Preferably, the liquid repellent film comprises triazine thiol compound.

Preferably, at least a surface of the plurality of barrier walls comprises single metal or metal alloy of nonoxide.

Preferably, the plurality of barrier walls are line arrangement that directly or indirectly connect to the luminescent element.

Preferably, the luminescent element is connected to a luminescent driving circuit that has a transistor.

In the present invention, it is preferable that the pixel electrode has a surface comprising metal oxide.

In the present invention, it is preferable that the pixel electrode is applied with lyophilic processing, and the lyophilic processing includes at least one of oxygen plasma processing or UV-ozone processing.

Preferably, at the liquid repellent film forming step, the liquid repellent film is formed selectively on a surface of the plurality of barrier walls.

Preferably, the liquid repellent film is electrically conductive in thickness direction.

In the present invention, a counter electrode forming step to form a counter electrode that electrically connects with the plurality of barrier walls through the liquid repellent film, is provided after the drying step.

The luminescent element may have a structure of top emission type or a bottom emission type.

The present invention is a display device manufactured by the manufacturing method of the display device.

According to the manufacturing method of display device of the present invention, carrier transport layer of relatively uniform film thickness can be formed in pixel forming region of display pixel.

BRIEF DESCRIPTION OF THE DRAWINGS

FIG. 3 is a cross sectional view of process flow showing an example of manufacturing method of display device (display panel) according to the present embodiment;

FIG. 5 is a cross sectional view of process flow showing an example of manufacturing method, continued from FIG. 4;

DETAILED DESCRIPTION OF THE PREFERRED EMBODIMENTS

Hereinafter, display device and manufacturing method thereof according to the present invention is described in detail with reference to embodiments.

(Display Panel)

First of all, schematic structure of display device (display panel) according to the present invention is described.

Figure 1:
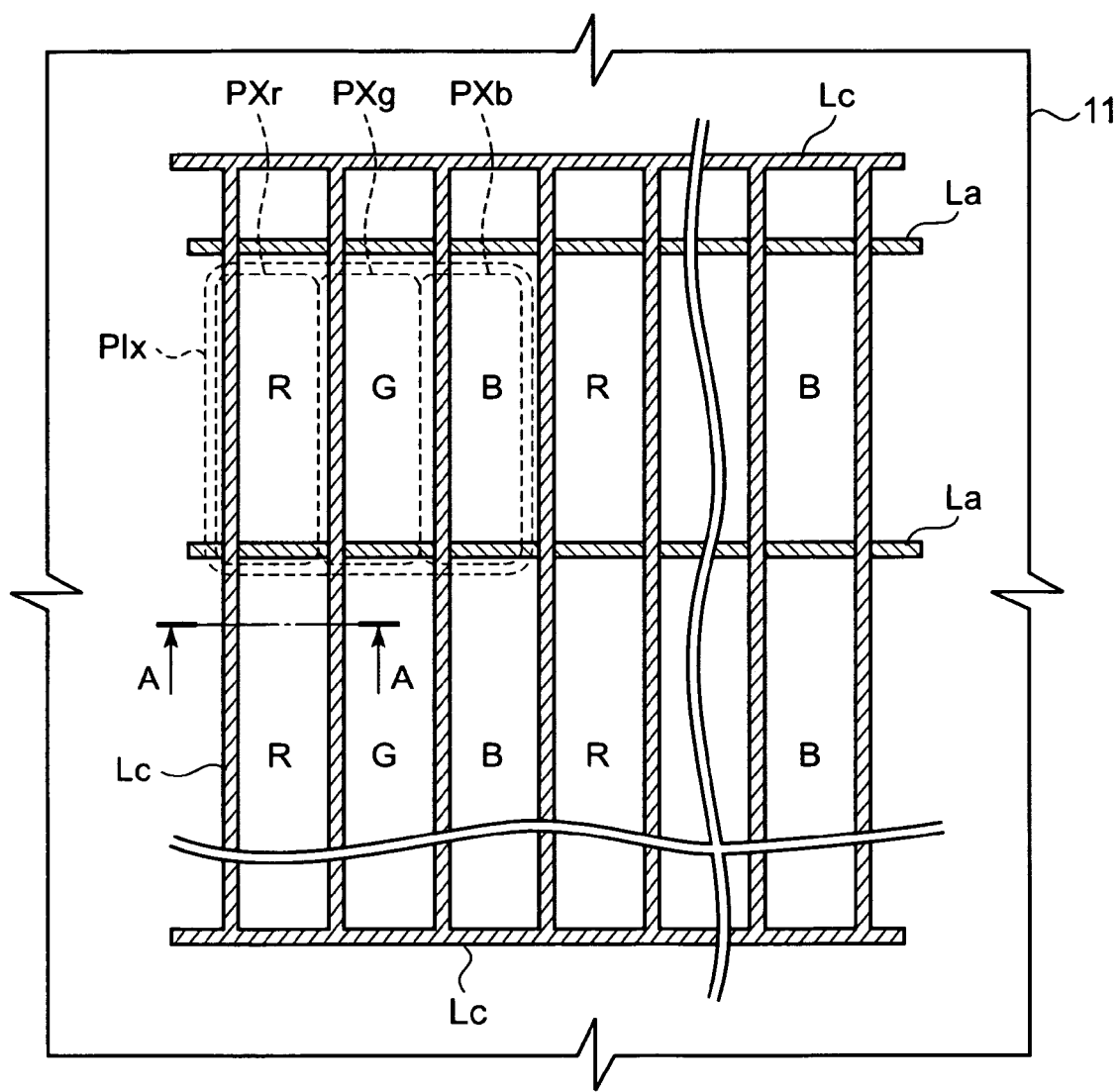
FIG. 1 is a schematic plane view of substantial part showing one embodiment of display device (display panel) according to the present invention.
Figure 2:
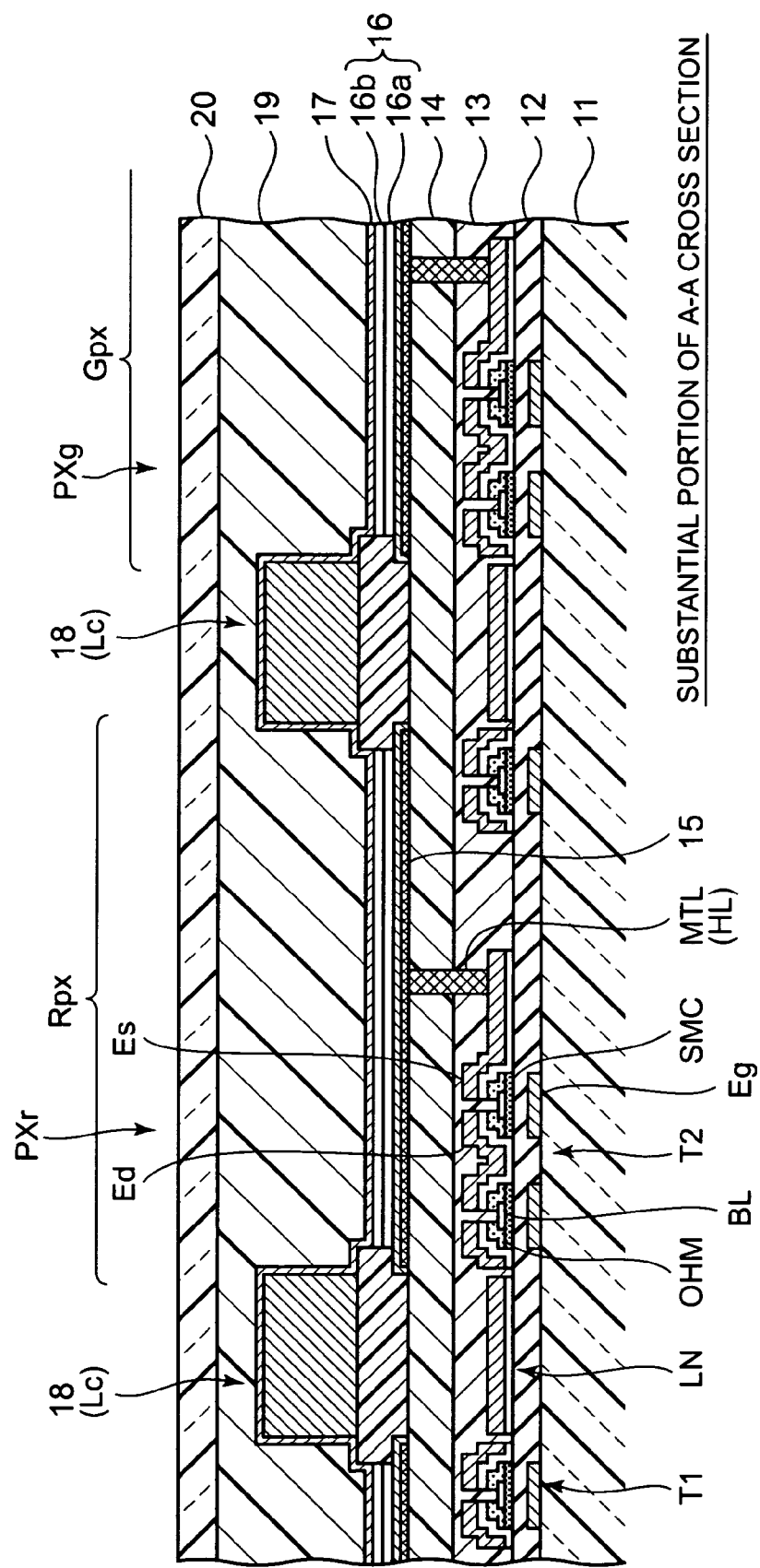
FIG. 2 is a schematic cross sectional view of substantial part showing one embodiment of display device (display panel) according to the present invention.

FIG. 1 is a schematic plane view of substantial portion showing one embodiment of display device (display panel) according to the present invention, and FIG. 2 is a schematic cross sectional view of substantial portion showing one embodiment of display device (display panel) according to the present invention. Here, in the plane view shown in FIG. 1, for convenience of illustration, each pixel forming region and arrangement structure of anode line La and cathode line Lc, when seen from the viewpoint side, are only shown, and other structure (transistor such as amorphous silicon thin-film transistor and the like) shown in FIG. 2 is omitted. In addition, FIG. 1 shows a case where color pixels PXr, PXg, and PXb of adjacent three colors red (R), green (G), and blue (B) structure display pixel PIX as one unit. FIG. 2 shows cross sectional structure with forming region Rpx of red pixel PXr in center.

Display device according to one embodiment of the present invention (display panel provided with organic EL element) is, as shown in FIGS. 1 and 2, structured by providing on a substrate with insulating property (insulating substrate) such as glass substrate and the like, one or a plurality of transistors (in FIG. 2, two transistors T1 and T2 are shown for convenience) structuring luminescent driving circuit (luminescent driving section; specific example given later) to luminescent drive organic EL element, and, various line arranging layers LN including anode line La, cathode line Lc, data line, and scanning line that are directly or indirectly connected to transistors T1 and T2. Further, protective insulating film 13 comprising silicon nitride and the like, and planarizing film 14 comprising photo-sensitive resin and the like, are laminated so as to cover the transistors T1 and T2 and the line arranging layer LN partially.

Each of transistors T1 and T2 are structured comprising, for example, a gate electrode Eg formed on the insulating substrate 11, a semiconductor layer SMC formed in the region corresponding to each gate electrode Eg with intermediary of gate insulating film 12, an impurity layer OHM formed on both ends of the semiconductor layer SMC, and a source electrode Es and a drain electrode Ed each formed on the impurity layer OHM. In addition, to the protective insulating film 13 and planarizing film 14 that are laminated on transistors T1 and T2, and line arranging layer LN, contact hole HL is provided arbitrarily, and metal material (contact metal MTL) is embedded so that the transistor and the conductive layer on the planarizing layer 14 (for example, pixel electrode 15 described later) are connected electrically.

Further, to regions on the planarizing film 14 that is subject to form each color pixel (refer to forming region Rpx of red pixel PXr in FIG. 2), an organic EL element structured by stacking pixel electrode 15 with at least light reflecting property and becomes anode electrode for example, organic EL layer (carrier transport layer and light emitting layer) comprising positive hole transport layer 16a and electron transporting light emitting layer 16b, and counter electrode 17 with transparency and becomes cathode electrode for example, is provided.

In addition, in between the forming region of each adjacent color pixel (precisely, in the boundary of mutual forming region of organic EL element), bank (barrier wall) 18 (row-direction portion of cathode line LC in FIG. 1) is provided so as to protrude from the planarizing film 14 (insulating substrate 11). Further, on the insulating substrate 11 including the organic EL element and the bank 18, sealing substrate (counter electrode) 20 comprising glass substrate and the like is attached so as to face the insulating substrate 11 with intermediary of transparent sealing resin layer 19.

In particular, concerning display device (display panel) according to the present embodiment, forming regions Rpx, Gpx . . . of each color pixels PXr, PXg, and PXb are defined by the bank 18. Simultaneously, by using conductive material such as metal material and the like as the bank 18, as shown in FIG. 1, metal conductive layer (cathode line Lc) can be arranged in reticular pattern in between each display pixels PIX (each color pixel PXr, PXg, and PXb) arranged two-dimensionally on the display panel (insulating substrate 11). Further, as shown in FIG. 2 for example, by letting counter electrode 17 of organic EL element of each display pixels PIX (each color pixel PXr, PXg, and PXb) lie on the bank 18, as well as connecting the counter electrode 17 and the bank 18 electrically, it has a structure in which bank 18 is used as cathode line Lc to supply predetermined shared voltage (ground potential and the like) to the counter electrode 17.

Concerning display device with such structure, for example, within the luminescent driving circuit comprising transistors T1, T2, and line arranging layer LN, that are provided on lower layer of the display panel (layer on the side of insulating substrate 11 of the organic EL element), luminescent driving current with predetermined current value flows in between drain and source of the transistor T2 according to tone signal (display data) supplied through data line not shown, and by the luminescent driving current being supplied from the transistor T2 to the pixel electrode 15 of the organic EL element through contact metal MTL embedded in contact hole HL, the organic EL element emits light at a predetermined luminance tone corresponding to the display data.

Here, in a case where the organic EL element is a top emission type, that is, in a case where the pixel electrode 15 is a light reflecting electrode (as shown in FIG. 2, it may be a laminated structure of reflecting metal layer 15a such as aluminum and the like, and metal oxide layer 15b of a transparent electrode material comprising a compound or mixture containing at least one among indium oxide, zinc oxide, and tin oxide (for example, tin-doped indium oxide (ITO), zinc-doped indium oxide, and the like), that contacts the organic EL layer 16), and the cathode electrode 17 is a transparent conductive film of ITO, zinc-doped indium oxide, and the like for example, light that was emitted at organic EL layer 16 of each display pixels PIX (each color pixels PXr, PXg, and PXb) is outputted in direction of sealing substrate 20 (viewpoint side; upper side of figure in FIG. 2) through sealing resin layer 19, either directly through counter electrode 17 with transparency, or reflected by pixel electrode 15 with light reflecting property.

(Manufacturing Method of Display Device)

Next, description on manufacturing method of display device (display panel) with afore-mentioned structure is given. FIGS. 3 to 6 are cross sectional views of process flow showing an example of manufacturing method of display device (display panel) of top emission type according to the present embodiment. FIG. 7 is a chemical formula showing molecular structure of coating material applied to manufacturing method of display device (display panel) according to the present embodiment. Here, bottom emission type can also be manufactured by following the manufacturing method of top emission type.

The manufacturing method of display device (display panel) according to the present embodiment is, first of all as shown in FIG. 3A, a plurality of transistors T1 and T2, line arranging layer LN, and the like, that structure luminescent driving circuit to generate and supply luminescent driving current to the organic EL element having current value corresponding to display data, are formed. Here, a plurality of transistors T1 and T2, line arranging layer LN, and the like are formed on one side (upper side in figure) of the insulating substrate 11 such as glass substrate and the like, for each region corresponding to each display pixel PIX (each color pixel PXr, PXg, and PXb).

In particular, to one side of the insulating substrate 11, for example, gate electrode Eg comprising metal material and line arranging layer connected to the gate electrode Eg is formed, and then gate insulating film 12 is formed by covering the entire insulating substrate 11 with insulating film. Subsequently, to a region on the gate insulating film 12 that corresponds to the gate electrode Eg, semiconductor layer SMC comprising amorphous silicon, poly silicon, and the like is formed for example, impurity layers OHM to achieve ohmic connection of semiconductor layer SMC with source electrode Es, and semiconductor layer SMC with drain electrode Ed, are provided on both edge of the semiconductor layer SMC respectively. The source electrode Es, the drain electrode Ed, and conductive film that becomes the base of these electrodes are formed on the impurity layer OHM by patterning at once, and scanning line, data line, and anode line La that connect to transistors T1 and T2 are arbitrarily formed.

Here, on the semiconductor layer SMC, block layer BL may be provided in order to prevent etching damage to the semiconductor layer SMC when patterning the source electrode Es, the drain electrode Ed, and the line arranging layer LN. In addition, in order to decrease line arranging resistance and also decrease migration, the source electrode Es, the drain electrode Ed, scanning line, data line, and anode line La have a laminated line arranging structure comprising aluminum alloy and transition metal.

Next, as shown in FIG. 3B, protective insulating film (passivation film) 13 and planarization film 14 are formed in this order so as to entirely cover one side of the insulating substrate 11 including the transistors T1, T2, scanning line, data line, and anode line La. Subsequently, in a manner so as to penetrate the planarizing film 14 and the protective insulating film 13, for example, contact hole HL that expose upper side of source electrode (or drain electrode) of a particular transistor (luminescent driving transistor) T2 that structure the luminescent driving circuit is formed.

Figure 4A:
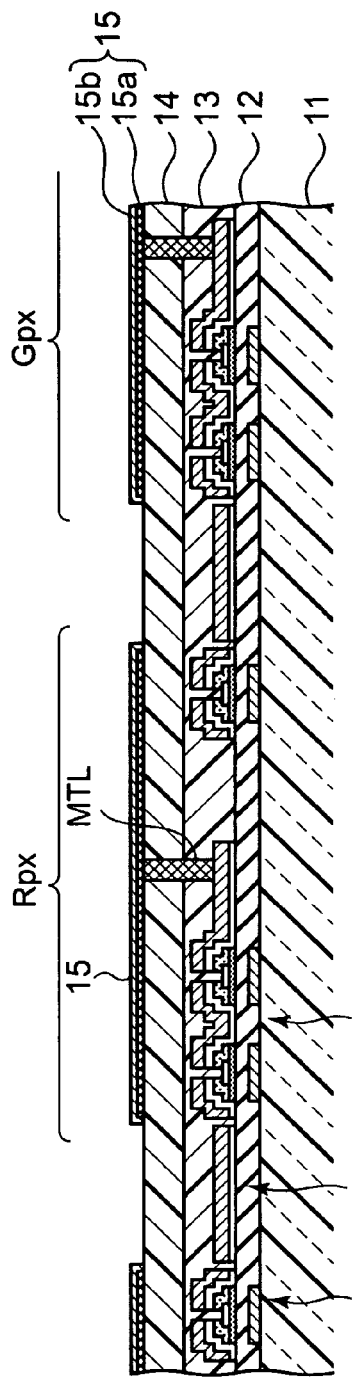
FIG. 4 is a cross sectional view of process flow showing an example of manufacturing method, continued form FIG. 3.

Next, as shown in FIG. 3C and FIG. 4A, after contact metal MTL is embedded in the contact hole HL, pixel electrode 15, that is electrically connected to the contact metal MTL, is formed in forming regions Rpx, Gpx, . . . of each color pixels PXr, PXg, . . . . Here, in particular, the pixel electrode 15 is formed by, after conducting patterning to form thin film of reflecting metal layer 15a having light reflecting property such as aluminum (Al), patterning is conducted by forming thin film of metal oxide layer 15b such as ITO, zinc-doped indium oxide, and the like, so as to cover the reflecting metal layer 15a. In order to prevent cell reaction with the reflecting metal layer 15a during patterning upper layer of the metal oxide layer 15b, it is preferable to form a film of metal oxide layer 15b after patterning reflecting metal layer 15a, and conduct patterning of the metal oxide layer 15b so that the reflecting metal layer 15a is not exposed.

As described, since the pixel electrode 15 has a laminated electrode structure of reflecting metal layer 15a as lower layer and metal oxide layer 15b as upper layer, upper side and end side of the reflecting metal layer 15a is covered by the metal oxide layer 15b, thus over etching and etching damage to the reflecting metal layer 15a as lower layer during patterning the metal oxide layer 15b can be prevented even in case where etching conditions of the reflecting metal layer 15a and metal oxide layer 15b are different.

As described, metal oxide layer 15b that structures upper layer of the pixel electrode 15 is, for example, formed by forming film of transparent electrode material comprising a compound or mixture containing at least one among indium oxide, zinc oxide, and tin oxide (for example, tin-doped indium oxide (ITO), zinc-doped indium oxide, and the like) by electron beam deposition method, sputtering method, ion plating method, or the like, and then conducting patterning that correspond to planar structure (luminescent region) of organic EL element.

Figure 4B:
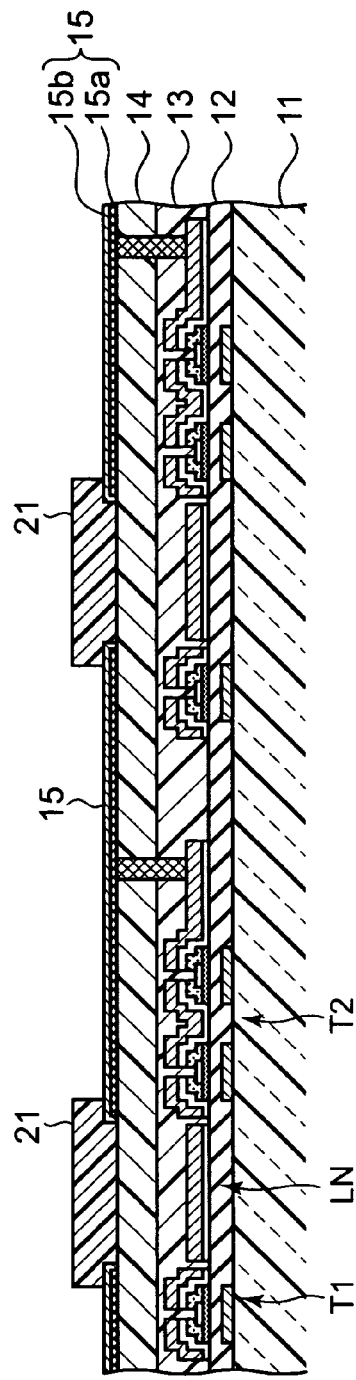

Next, to region in between pixel electrodes 15 that are formed corresponding to forming regions Rpx, Gpx, . . . of each of the color pixels PXr, PXg, . . . , (that is, in the boundary of forming regions Rpx, Gpx, . . . of mutually adjacent color pixels PXr, PXg . . . ), bank base layer 21 comprising inorganic insulating material such as silicon nitrate layer and the like is formed for example, as shown in FIG. 4B.

Figure 4C:
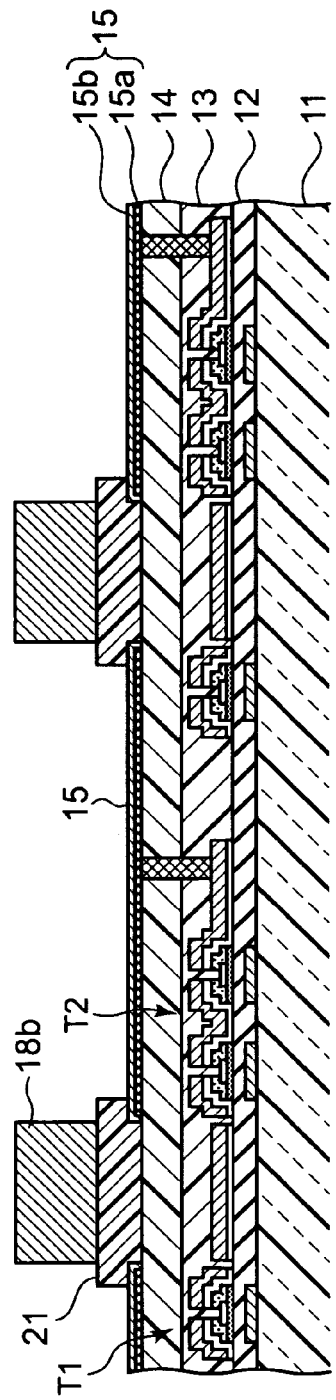

Further, as shown in FIG. 4C, bank metal portion 18b (metal conductive layer; corresponds to cathode line Lc of FIG. 1) comprising metal material with low resistance, and at least its surface being nonoxide of copper, silver, aluminum, single metal or metal alloy including these metal as major component, is formed on the bank base layer 21, for example. Thus, region surrounded by bank metal portion 18b (cathode line Lc) and bank (barrier wall) 18 comprising bank base layer 21 is defined as forming regions Rpx, Gpx, . . . of each color pixels PXr, PXg, . . . (that is, luminescent region of organic EL element). Here, surface of the bank metal portion formed to the bank 18 may be gold-plated to prevent oxidation of the surface and enhance film formation of triazine thiol compounds described later. In place of the bank metal portion 18b, nonconductive material (polyimide for example) with the same structure may be formed, and provided with conductivity by applying gold-plating to its surface to enhance film formation of triazine thiol compounds.

Next, as shown in FIG. 5A, a film forming processing is conducted to form a thin film with liquid repellency (liquid repellent film) comprising triazine thiol compound film 18c of triazine thiol, fluoride type triazine dithiol derivatives, or the like, selectively on the surface of the bank metal portion 18b. In particular, after cleaning the insulating substrate 11 formed with the bank 18 by UV ozone cleaning, it is placed into chamber filled with water solution of triazie thiol compound, thus immersed into the water solution. In this processing, temperature of the water solution is kept at approximately 20 to 30 degrees Celsius, and time of immersion is approximately 1 to 10 minutes. Here, the triazine thiol compound becomes selectively bonded to the metal. Therefore, even when processing with triazine thiol compound is conducted, surface of the pixel electrode 15 would not show liquid repellency as long as the surface of the pixel electrode 15 is a metal oxide such as ITO. However, it does not become coated on metal oxide, organic insulating film, and inorganic insulating film to an extent that is shows liquid repellency. Next, by flushing the insulating substrate 11 taken out of the water solution with alcohol, excess triazine thiol compound on the insulating substrate 11 is washed off, then after secondary cleaning by water, it is dried by blowing nitrogen gas ($N_2$).

Figure 7A:
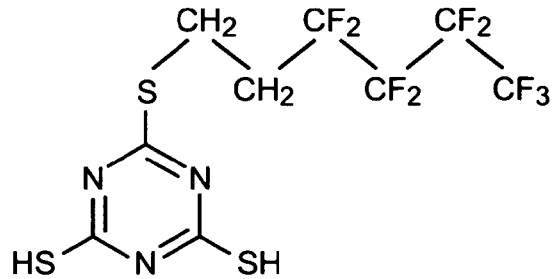
FIG. 7 is a chemical formula showing molecular structure of coating material applied to manufacturing method of display device (display panel) according to the present embodiment.
Figure 7B:
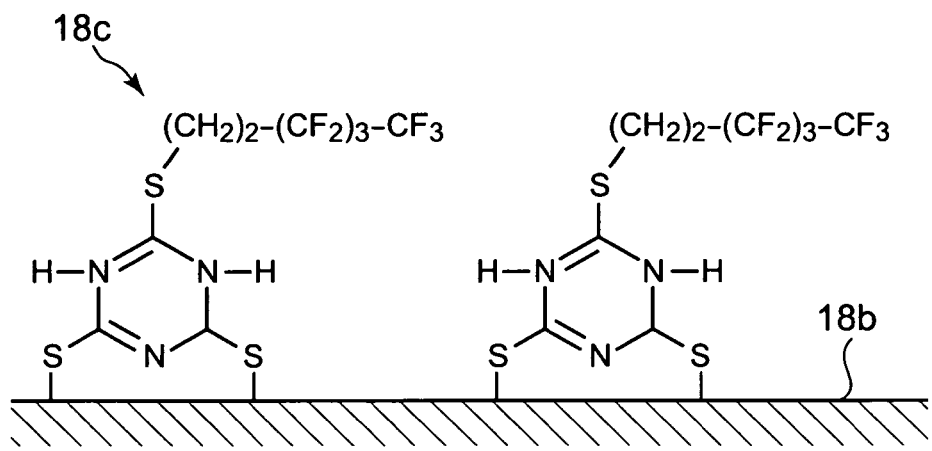

Here, as one example of triazine thiol compound used in the afore-mentioned film forming processing, the fluoride type triazine dithiol derivative has a structure in addition to the one as shown in FIG. 7A, in which thiol group (—SH) is bonded as functional group of triazine (six-membered ring structure including three nitrogen), a structure in which at least one thiol group is left as original thiol group, and a carbon hydrate group such as an alkyl group (—$CH_2$—$CH_2$—), and a functional group with fluoride atom such as an alkyl fluoride group (—$CF_2$—$CF_2$—$CF_2$—$CF_3$) is bonded to the S atom of a particular thiol group (—SH) other than the thiol group let as original thiol group. In addition, such triazine thiol compounds form film of liquid repellent conductive layer 18c which makes the surface of the bank metal portion 18b liquid repellent, as shown in FIG. 7B for example. That is, the thiol group releases hydrogen atom and selectively bonds to the metal of the surface of bank metal portion 18b. However, it does not bond to metal oxide, organic insulating film, and inorganic insulating film to an extent that is shows distinct liquid repellency. Since the fluoride type triazine dithiol derivative contains fluorine atom that shows further liquid repellency in addition to triazine thiol compound that shows liquid repellency itself, the liquid repellent conductive film 18c shows further strong liquid repellency than triazine thiol. Here, in the afore-mentioned processing, concentration of water solution used is preferably in the range of approximately $1\times10^{-4}$ to $1\times10^{-2}$ mol/L.

Here, the afore-mentioned fluoride type triazine dithiol derivative had S atom of thiol group bonded to the alkyl group (—$CH_2$—$CH_2$—), however, it may be directly bonded to the alkyl fluoride group. The number of carbon atoms of alkyl group and alkyl fluoride group is not limited so long as it does not become an extreme steric hindrance. In addition, the afore-mentioned fluoride type triazine dithiol derivative may be, at the S atom of one of the two remaining thiol group, directly or indirectly substituted with alkyl fluoride group in place of hydrogen group, or carbon atoms of functional group including fluorine atom may have olefin double bond. Further, as other triazine dithiol derivatives, for example, 6-dimethylamino-1,3,5-triazine-2,4-dithiol sodium salt or 6-didodecylamino-1,3,5-triazine-2,4-dithiol sodium salt may be dissolved in water, and liquid repellent conductive film 18c may be formed.

Thus, within each structure formed on one side of the insulating substrate 11, liquid repellent conductive film 18c of triazine thiol compound is formed only on the surface of bank metal portion 18c comprising metal material. Meanwhile, the triazine thiol compound shows poor adhesion to the surface of the pixel electrode coated with metal oxide layer (ITO and the like) 15b, the surface of the bank base layer 21, and planarizing layer 14 (or protective insulating film 13) exposed from between the pixel electrodes 15, thus film is not formed. Therefore, on the identical insulating substrate 11, a state in which only the surface of the bank metal portion 18b is applied with liquid repellent processing, and the surface of the pixel electrode 15 exposed at forming regions Rpx, Gpx, . . . of each pixel defined by the bank 18 is not applied with liquid repellent processing, is achieved.

Therefore, on the identical insulating substrate 11, a state in which the surface of bank 18 (bank metal portion 18b) shows liquid repellency, due to liquid repellent conductive film 18c of triazine thiol compound such as fluoride type triazine dithiol derivative and the like, toward positive hole transport material described later, is maintained. Meanwhile, a state in which the surface of the pixel electrode 15 exposed at forming regions Rpx, Gpx, . . . of each pixel defined by the bank 18 shows compatibility (shows lyophilic property), compared to afore-mentioned surface of the bank 18, toward positive hole transport material described later, is maintained.

Here, "liquid repellency" mentioned in the present embodiment is specified as a state in which contact angle is 50 degrees or larger. The contact angle is measured by placing a droplet of organic compound containing solution containing positive hole transport material as positive hole transport layer described later, organic compound containing solution containing electron transporting light emitting material as electron transporting light emitting layer described later, or organic solvent used for these solutions. In addition, "lyophilic property" in contrast to "liquid repellency" is specified as a state in which the contact angle is 40 degrees or less in the present embodiment.

Next, as shown in FIG. 5B, to forming regions Rpx, Gpx, . . . of each pixels PXr, PXg . . . , defined by the bank metal portion 18b (bank 18) of which the surface is made liquid repellent by the liquid repellent conductive film 18c of triazine thiol compound, positive hole transport material containing solution 16a' is coated by using ink jet method which jet a plurality of mutually separated ink droplets to a predetermined position, or by using nozzle print method which pours solution to a predetermined position continuously. At this time, the positive hole transport material containing solution 16a' is spread entirely to the pixel electrode 15, due to the processing to apply lyophilic property to the metal oxide film 15b. Since it is repelled by the liquid repellent conductive film 18c in the periphery of forming regions Rpx, Gpx, . . . of each pixels PXr, PXg, . . . , the periphery is not coated thickly. Subsequently, the water solution is dried and thus positive hole transport layer 16a is formed. In particular, as an organic compound containing solution (compound containing solution) containing positive hole transport material of high molecular type, for example, water solution of polyethylene dioxy thiophene/polystyrene sulfonic acid (PEDOT/PSS; a dispersion solution in which polyethylene dioxy thiophene PEDOT as conductive polymer and polystyrene sulfonic acid PSS as dopant are dispersed in aqueous solvent) is poured from ink head not shown, and coated on the pixel electrode 15 (metal oxide film 15b). Subsequently, by removing solvent by conducting drying processing by making an oven provided with the substrate 11 within nitrogen atmosphere (inert gas atmosphere), and heating the substrate 11 wholly, positive hole transport material of high molecule type is fixed on the pixel electrode 15, and thus positive hole transport layer 16a as carrier transport layer is formed. When carrier transport layer such as positive hole transport layer 16a is dried by heating under inert gas atmosphere such as nitrogen atmosphere, degradation of liquid repellency within the liquid repellent conductive film 18c of triazine thiol compound can be suppressed, compared to a case in which heating processing is conducted under atmosphere including oxygen.

As described, the surface of the pixel electrode 15 (metal oxide film 15b) is made hydrophilic when the substrate 11 was cleaned by UV ozone, thus liquid repellent conducive film 18c with liquid repellency is scarcely formed. Therefore, the surface of the pixel electrode 15 shows higher wettability and have higher compatibility towards organic compound containing solution (water solution of polyethylene dioxy thiophene/polystyrene sulfonic acid, PEDOT/PSS), compared to the surface of bank 18 (bank metal portion 18b) which is applied with liquid repellent processing by liquid repellent conductive film 18c of triazine thiol compound. As a result, the organic compound containing solution spreads well to the entire region of forming regions Rpx, Rgx, . . . of each color pixel PXr, PXg, . . . , and thus positive hole transport layer 16a with uniform film property and thickness can be obtained, within suppressing aggregation of the positive hole transport material. Meanwhile, the organic compound containing solution that landed the surface of bank 18 (bank metal portion 18b) which is applied with liquid repellent processing by liquid repellent conductive film 18c of triazine thiol compound is repelled and moves to the surface of the pixel electrode 15, thus positive hole transport layer 16a does not deposit thickly in the periphery.

Here, prior to processing of coating organic compound containing solution on the pixel electrode 15, a processing to apply further lyophilic property only to the surface of pixel electrode 15 (metal oxide 15b) may be conducted. For example, a processing to form base film that shows lyophilic property towards the organic compound containing solution, a well known oxygen plasma processing, and a UV-ozone processing, that are processing to make droplet of organic compound containing solution more wettable and compatible, may be conducted.

As mentioned above, concerning the present embodiment, organic compound including solution (polyethylene dioxy thiophene/polystyrene sulfonic acid (PEDOT/PSS) is applied on the pixel electrode 15 (metal oxide film 15b), and then solvent is removed by heat processing in nitrogen atmosphere in case positive hole transport layer 16a is formed. Therefore, film of triazine thiol compound 18c formed on the surface of the bank (bank metal portion 18b) is prevented from degradation due to the above mentioned heat processing, thus liquid repellency is maintained well. Here, relationship between liquid repellency of the liquid repellent conductive film 18c of triazine thiol compound and heat processing will be described in detail later.

Figure 6A:
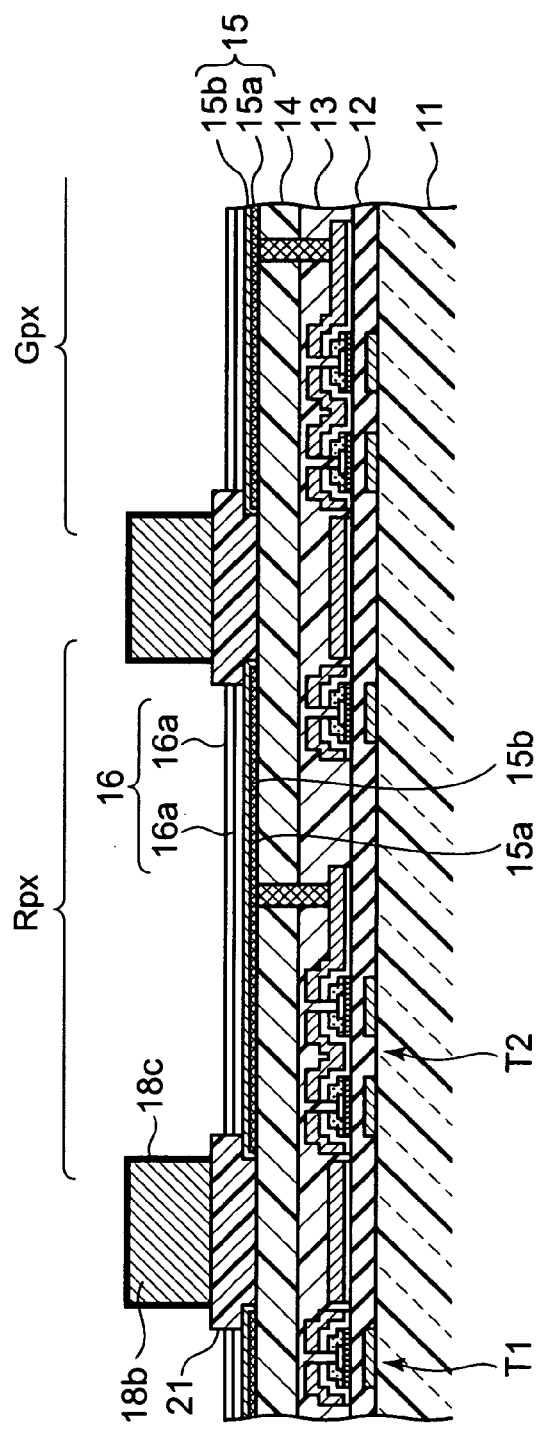
FIG. 6 is a cross sectional view of process flow showing an example of manufacturing method, continued from FIG. 5.

Next, as in the same manner as in the case of the aforementioned positive hole transport layer 16a, as shown in FIG. 6A, water solution of electron transporting light emitting material is applied using methods such as ink jet method that ejects liquid droplet that are separated individually from the ink head, or nozzle coat method that emits in a continuous liquid without separation, to the forming regions Rpx, Gpx, . . . of each color pixels PXr, PXg, . . . . Subsequently, the water solution is dried, and electron transporting light emitting layer 16b is formed. In particular, as for organic compound containing solution (compound containing solution) containing electron transporting light emitting material of organic high molecule type, a solution in which light emitting material such as polyfluorene type, poly paraphenylene vinylene type, and the like, dissolved in organic solvent such as tetralin, tetra methyl benzene, mesitylene, xylene, and the like, can be mentioned for example. The afore-mentioned organic compound containing solution is ejected from a nozzle head not shown, using methods such as ink jet method, or nozzle coat method. After application onto the positive hole transport layer 16a, solvent is eliminated by drying processing that heats the entire substrate 11 under nitrogen atmosphere, or by drying processing that uses sheathed heater in vacuum, to fix electron transporting light emitting material of organic high molecular type on the positive hole transport layer 16a, and thus electron transporting light emitting layer 16b that is a carrier transport layer and is also a light emitting layer, is formed. Here, as for the light emitting material, a material with each colors of red, green, and blue, corresponding to the forming regions Rpx, Gpx, . . . of each color pixels PXr, PXg, . . . is used.

Here, since the organic compound containing solution (electron transporting light emitting material) has high wettablility towards dried positive hole transport layer 16a, and liquid repellency of liquid repellent conductive film 18c of triazine thiol compound formed on the surface of the bank (bank metal portion 18b) is maintained well, the organic compound containing solution (electron transporting light emitting material) spreads sufficiently throughout the forming regions Rpx, Gpx, . . . of each color pixels PXr, PXg, . . . , as well as surging (climbing up) of liquid end portion at the side of the bank 18 can be prevented.

Therefore, electron transporting light emitting layer 16b with uniform film property and uniform film thickness can be formed on the forming regions Rpx, Gpx, . . . of each color pixels PXr, PXg, . . . , and the organic compound containing solution does not fix at the surface of the bank 18 (bank metal portion 18b). In addition, it does not leak into forming region of adjacent color pixel within going over the bank 18. Therefore, organic EL layer 16 (positive hole transport layer 16a and electron transporting light emitting layer 16b) with uniform film property and uniform film thickness can be formed on the pixel electrode 15, as well as blending of electron transporting light emitting layer 16b between adjacent color pixels can be prevented.

Figure 6B:
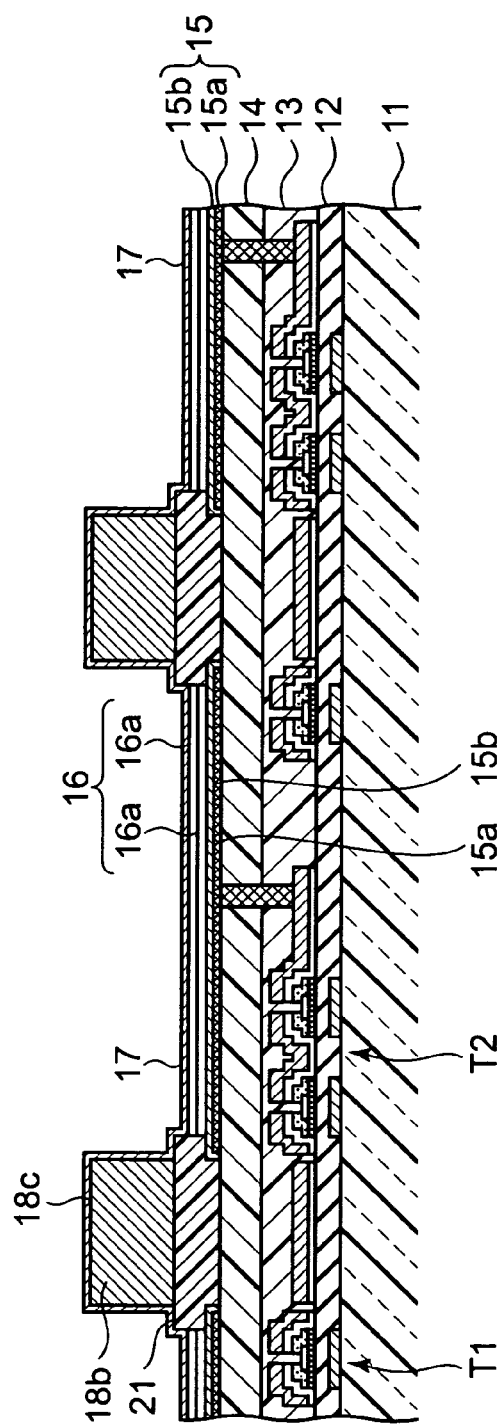

Next, as shown in FIG. 6B, transparent electrode layer is formed on the insulating substrate 11 including the forming regions Rpx, Gpx, . . . of each color pixels PXr, PXg, . . . , and counter electrode 17 that oppose the pixel electrode 15 is formed, with at least the organic EL layer 16 (positive hole transport layer 16a and electron transporting light emitting layer 16b) in between. Here, the counter electrode 17 is formed as uniform counter electrode that lies over at least from the organic EL layer 16 formed on the forming regions Rpx, Gpx, . . . of each color pixels PXr, PXg, . . . , to the bank 18 that define the forming regions Rpx, Gpx, . . . of each color pixels PXr, PXg, . . . . In particular, the counter electrode 17 has a structure in which metal material with relatively low work function such as calcium (Ca), barium (Ba), lithium (Li), indium (In) and the like is formed in a thin film with film thickness less than the wavelength of visible light (approximately 400 nm or less, 10-20 nm for example), and then on the upper layer, a transparent electrode film of transparent electrode material comprising a compound or mixture containing at least one among indium oxide, zinc oxide, and tin oxide (for example, tin-doped indium oxide (ITO), zinc-doped indium oxide, and the like), is laminated in order to reduce sheet resistance.

Within this structure, lower layer of metal material with low work function such as calcium, indium, or the like, closely contacts organic material that structure organic EL layer 16 (electron transporting light emitting layer 16b) in an electrically excellent state. Simultaneously, the since it has a film thickness less than the wavelength of visible light, light emitted at the organic EL layer 16 is penetrated excellently. In addition, since the upper layer of transparent electrode film comprising ITO or the like is enhanced in resistance by forming the lower layer of metal film extremely thin as 400 nm or less, it is laminated for the purpose of decreasing resistance of the counter electrode 17. Further, it has a structure in which the counter electrode 17 lies so as to reach the bank 18. Therefore, the liquid repellent conductive film 18c or triazine thiol compound is provided in between the counter electrode 17 and the bank metal portion 18b (cathode line Lc). Here, since the liquid repellent conductive film 18c is formed so thin that it is conductive in the thickness direction, the counter electrode 17 and the bank metal portion 18b are electrically conductive. As a result, even in a case where thickness of the counter electrode 17 is made thin in order to improve light transmittance at the counter electrode 17, cathode as a whole can be made low in resistance by the bank metal portion 18b that are positioned in between pixels PXr, PXg, and PXb. Thus, excellent light emitting property can be obtained.

Subsequently, as shown in FIG. 2, after forming transparent sealing resin layer 19 on one side of insulating substrate 11 including forming regions Rpx, Gpx, ... of each color pixels PXr, PXg, ..., and the bank 18, sealing substrate 20 is attached so as to oppose the insulating substrate 11, thus display panel with a plurality of display pixel PIX (combination of each color pixels PXr, PXg, and PXb) arranged two-dimensionally, is completed. Here, as a method to attaching the sealing substrate 20 to the insulating substrate 11, a method in which UV curable adhesive or heat curable adhesive is applied on an attaching side of the sealing substrate 20, the substrate is placed on the insulating substrate 11, and then the adhesive is cured by UV irradiation or heating processing, can be used sufficiently.

Here, concerning the manufacturing method of the aforementioned display device (display panel), the relationship between liquid repellency of the liquid repellent conducting film 18c of triazine thiol compound and heat processing, during forming step of the positive hole transport layer 16a, is verified in specific, by showing experimental data.

In order to set a similar condition as with the forming step of the positive hole transport layer 16a as described in the afore-mentioned embodiment, a test sample with a thin film (coating film) of triazine thiol compound formed on a substrate of copper (Cu), which is a metal material applied to bank 18 (bank metal portion 18b) was used. Comparison verification was conducted for a case of heat processing in the atmosphere as a comparison example, and a case of heat processing under nitrogen atmosphere according to the present embodiment.

Thin film (coating film) of fluoride-type triazine thiol derivative that shows liquid repellency was prepared by immersing copper substrate, taken as bank metal portion 18b, into a water solution that is made by dissolving fluoride-type triazine thiol derivative and sodium hydrate (NaOH) in purified water. Here, each of the fluoride-type triazine thiol derivative and sodium hydrate had the same mole density of $2\times10^{-3}$ mol/L. The temperature of water solution during immersion step was approximately 23 degrees Celsius, and the time for immersion was set to three minutes. After immersion processing, cleaning by ethanol was conducted, followed with cleaning by purified water, and then dried by blowing nitrogen gas ($N_2$). Subsequently, concerning copper substrate with film of fluoride-type triazine thiol derivative formed (liquid repellent processed), contact angle was measured for a case in which the entire copper substrate was heat processed in atmosphere using hot plate, and a case in which the entire copper substrate was heated under nitrogen atmosphere using hot plate. Here, time for heat processing in atmosphere and under nitrogen atmosphere were each set to 15 minutes.

First of all, contact angle immediately after application of liquid repellent processing to the copper substrate was, as shown in Table 1, 117 degrees in the case of pure water, and 51 degrees in the case of mesitylene, which is an organic solvent used when forming electron transporting light emitting layer. In contrast, contact angle when heat processing was conducted in atmosphere was, 40 degrees in the case of pure water, and 3 degrees in the case of mesitylene. Thus, it became obvious that liquid repellency of the surface of the copper substrate lowered extremely, and became lyophilic.

Meantime, as shown in the present embodiment, contact angle when heat processing was conducted under nitrogen atmosphere was, 121 degrees in the case of pure water, and 50 degrees in the case of mesitylene. Thus, it became obvious that liquid repellency of the triazine thiol compound at the surface of the copper substrate is fairly maintained. Here, in the present embodiment, only the contact angle when heat processing was conducted under nitrogen atmosphere was verified, however, the present invention is not limited to this embodiment, and it became obvious according to various experiments conducted by the inventor, that similar result can be obtained even when other inert gas such as argon (Ar) and the like was used.

TABLE 1

| | Contact angle/degree | | |
| --- | --- | --- | --- |
| | after liquid repellent processing | after heat processing | |
| | | atmosphere | nitrogen atmosphere |
| pure water | 117 | 40 | 121 |
| mesitylene | 51 | 3 | 50 |

Therefore, according to the manufacturing method of the display device (display panel) of the present embodiment, the surface of the bank 18 have sufficient liquid repellency even after forming step of positive hole transport layer. As a result, concerning the following forming step of carrier transport layer of electron transporting light emitting layer and the like, phenomenon such as surging (climbing up) of liquid end portion of organic compound containing solution (electron transporting light emitting material) at the side of the bank 18, adhesion of the organic compound containing solution to the surface of the bank 18, and the organic compound containing solution going over the bank 18, can be prevented.

Therefore, on the pixel electrode 15 that expose at pixel forming region (forming regions Rpx, Gpx, ... of each color pixels PXr, PXg, ... ) on the insulating substrate 11, the organic EL layer 16 (positive hole transport layer 16a and electron transporting light emitting layer 16b) with uniform film property and film thickness in substantially all region can be formed without aggregation. As a result, organic EL element can be conducted with uniform light emitting operation in substantially all region inside each pixel forming region even when the size of each display pixel (pixel forming region) is enlarged. Thus, a display panel with high aperture ratio and excellent light emitting characteristic can be realized. In addition, in the forming step of the organic EL layer 16 (particularly the electron transporting light emitting layer 16b), blending between adjacent color pixels due to the organic compound containing solution going over the bank can be prevented, thus a display panel that can conduct image display with appropriate luminescent color can be realized.

Here, in the afore-mentioned embodiment, a structure in which the positive hole transport layer 16a and the electron transporting light emitting layer 16b are formed in this order as the organic EL layer 16 was described. However, the present invention is not limited to this structure, and the organic EL layer may have a structure with, a single layer structure of light emitting layer; a multi-layer structure comprising positive hole transport layer, light emitting layer, electron transport layer; a layer comprising a positive hole transporting light emitting layer and an electron transport layer; other carrier transport layer added arbitrarily; or a multi-layer structure that have carrier transporting property controlling layer (interlayer) provided in between positive hole transport layer and electron transporting light emitting layer for the purpose of causing recombination of electron and positive hole at predetermined position of the electron transporting light emitting layer by controlling positive hole transport of the positive hole transport layer. In this case, wherein the organic EL layer 16 is a multi-layer structure comprising a plurality of carrier transport layer, when forming all the other lower layers (for example, positive hole transport layer; interlayer; and in case of organic EL layer structured by stacking electron transporting light emitting layer in order, positive hole transport layer and interlayer) other than the uppermost layer, liquid repellency of the surface of bank can be maintained sufficiently without deterioration by conducting heat processing under nitrogen atmosphere in the same manner as the present embodiment. As described, organic compound containing solution that is repelled by the liquid repellent conducting film 18c in the periphery of the forming region Rpx, Gpx . . . of each color pixel PXr, PXg, . . . is not limited to positive hole transporting material containing solution, and may be a solution containing other carrier transporting layer material. In addition, the organic compound containing solution may be a solution dissolved in a solvent, or may be a suspension solution in which an organic compound is suspended.

Figure 9:
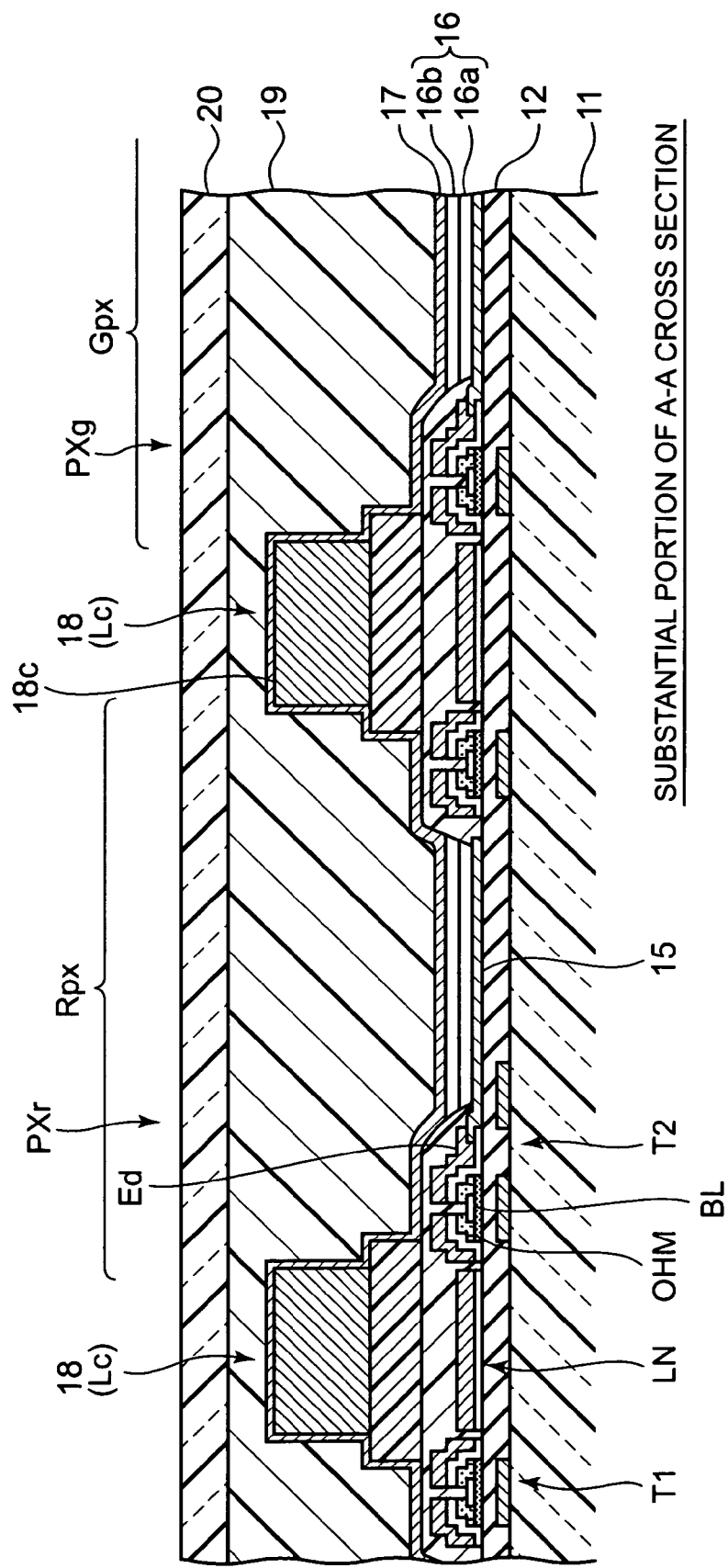
FIG. 9 is a schematic cross sectional view of substantial part showing another embodiment of display device (display panel) according to the present invention.
Figure 10:
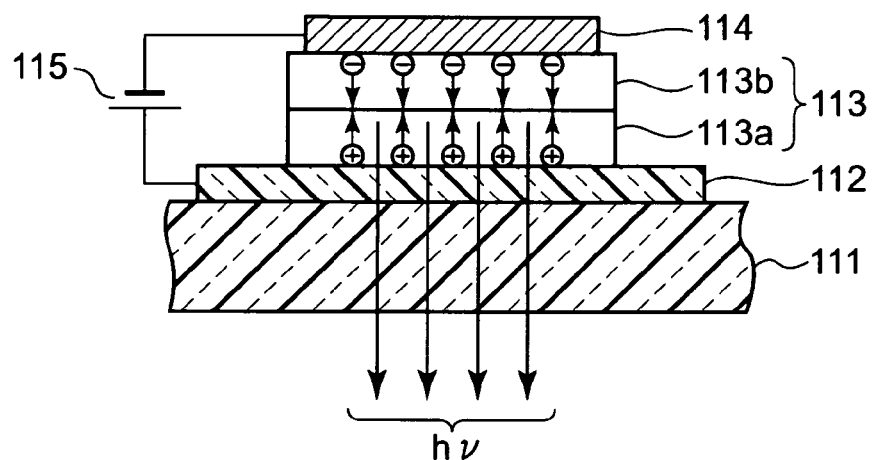
FIG. 10 is a schematic cross sectional view showing an example of structure of organic EL element.
Figure 11A:
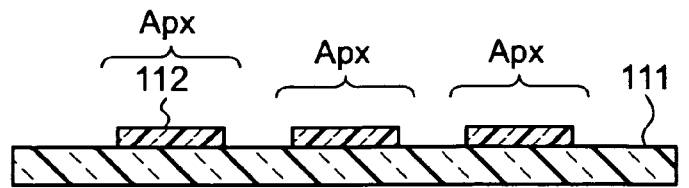
FIG. 11 is a cross sectional view of process flow showing an example of manufacturing process of display device (organic EL element) according to conventional technique.
Figure 11B:
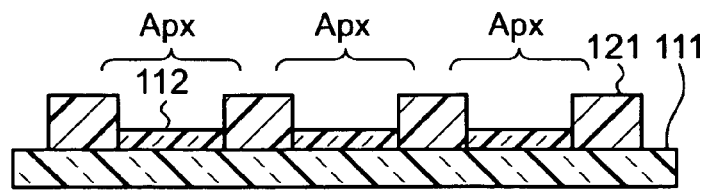
Figure 11C:
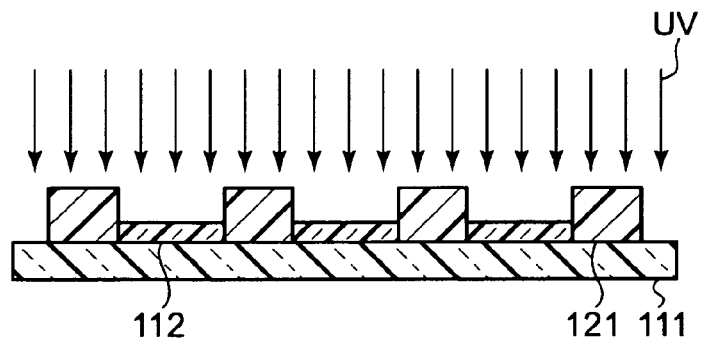
Figure 11D:
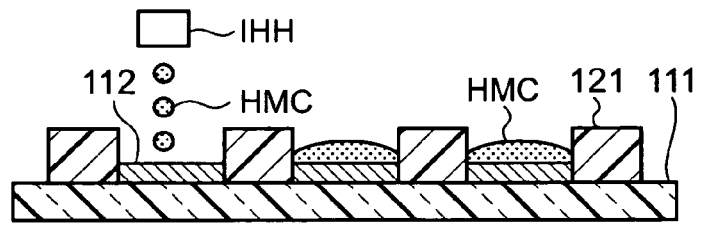
Figure 11E:
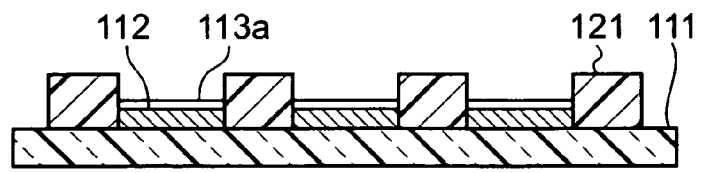
Figure 11F:
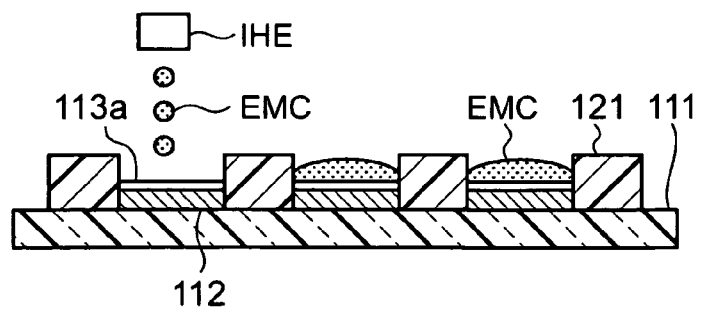
Figure 12A:
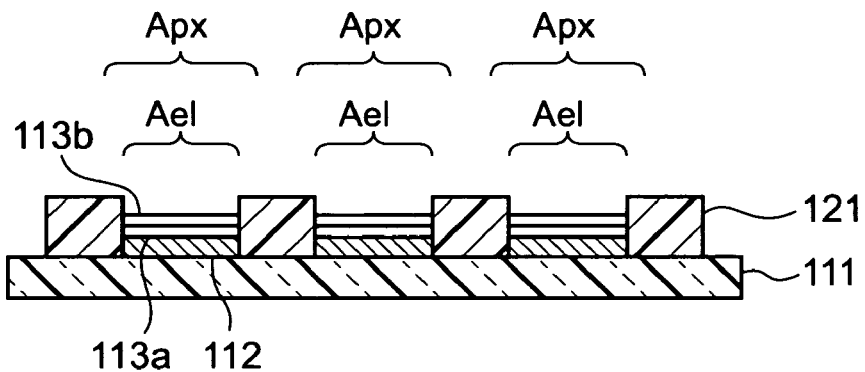
FIG. 12 is a cross sectional view of process flow showing another example of manufacturing process of display device (organic EL element) according to conventional technique.
Figure 12B:
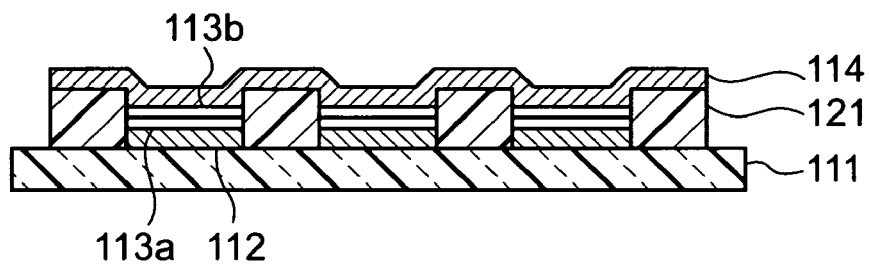
Figure 12C:
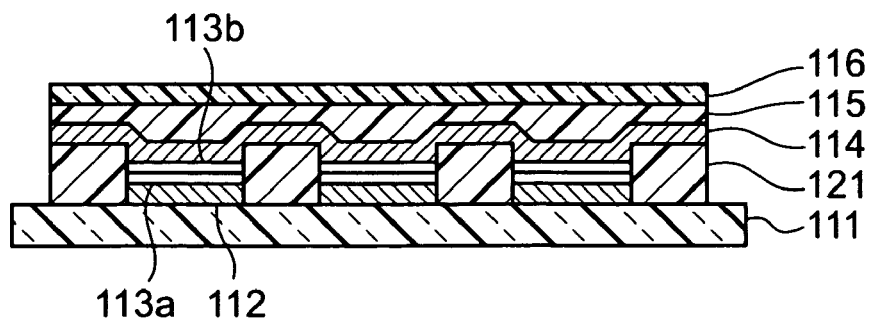

In addition, in the present embodiment, description was given for a case where manufacturing method of display device according to the present invention was applied to a display panel having a top emission structure. However, the present invention is not limited to this structure. As shown in FIG. 9, it may be sufficiently applied to a display panel having a bottom emission light emitting structure, that emits light toward the insulating substrate side, by conducting design layout with taking arrangement of transistors that structure luminescent driving circuit and line arranging layer into consideration. When it is a bottom emission type, contact metal MTL and planarizing layer 14 are not always needed, and pixel electrode 15 may be formed on substrate 11.

When the organic EL element is a bottom emission type, the pixel electrode 15 is a transparent electrode which functions as anode of material comprising a compound or mixture containing at least one among indium oxide, zinc oxide, and tin oxide (for example, ITO, zinc-doped indium oxide, and the like), and the counter electrode 17 may be a cathode electrode that has a laminated structure of electron injection film with relatively low work function such as Ca, Mg, Ba, Li, and the like, and protective conducting film such as Al and the like for the purpose to prevent oxidization of the electron injection film as well as decreasing sheet resistance. Light that was emitted at organic EL layer 16 of each display pixels is outputted through the substrate 11. Concerning bottom emission type, the planarization film 14 is not needed. In addition, protective insulating film 13 may not be formed in the region where the pixel electrode 15 is formed.

In particular, by conducting design layout so that transistors T1, T2, line arranging layer LN, and the like are arranged in region that overlaps with forming region of the bank 18 (bank metal portion 18b) when observed from planer view (that is, substantially lower layer region of the bank 18), even in case where light is emitted in the direction of the insulating substrate 11, aperture ratio of the display pixel PIX (display panel) is not decreased to so much extent, as well as uniform luminescent operation in relatively broad region (substantially all region) of the pixel forming region (organic EL element forming region) is conducted by applying the manufacturing method according to the present invention, thus a display panel with excellent light emitting property can be realized.

In the afore-mentioned embodiment, pixel electrode 15 was used as anode, and counter electrode 17 was used as cathode. However, pixel electrode 15 may be used as cathode, and counter electrode 17 may be used as anode.

In addition, bank metal portion 18b was used as a part of anode line La in the afore-mentioned embodiment, however, it may be applied as a part of cathode line Lc.

(Structure Example of Pixel Driving Circuit)

Figure 8:
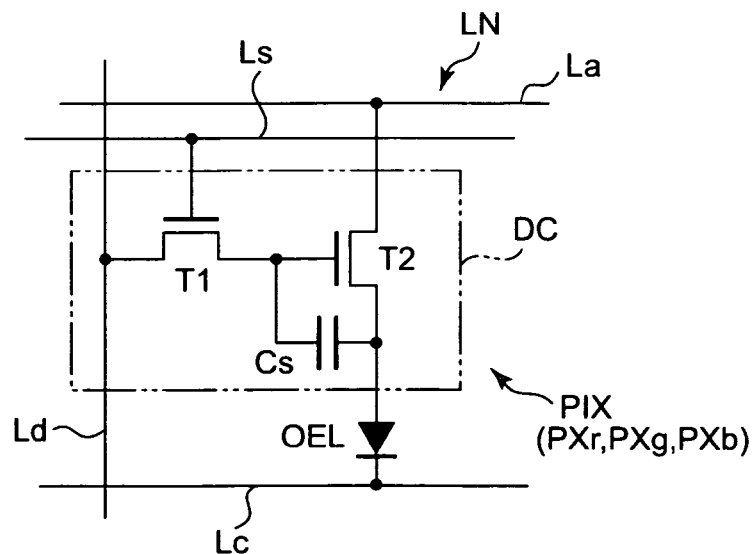
FIG. 8 is an equivalent circuit diagram showing an example of display pixel (luminescent driving circuit) arranged two-dimensionally on display panel of display device according to the present invention.

FIG. 8 is an equivalent circuit diagram showing an example of display pixel (luminescent driving circuit) that is arranged two-dimensionally on the display panel of the display device according to the present invention.

Display pixel PIX (color pixels PXr, PXg, PXb) that is applicable to the present invention is, as shown in FIG. 8 for example, structured provided with a luminescent driving circuit DC comprising transistors T1 and T2 that are provided on the insulating substrate 11, and an organic EL element OEL. Various kinds of line arranging layers LN including anode line La, cathode line Lc, data line Ld, scanning line Ls, that are directly or indirectly connected to the transistor T1, T2 are provided, then protective insulating film 13 comprising silicon nitrate and the like, and planarizing film 14 comprising photo-sensitive resin and are stacked so as to cover part of the transistors T1, T2 and the line arranging layer LN. Capacitor CS is provided in between gate-source of the transistor T2.

Here, in the present structure example, as for the luminescent driving circuit DC provided to display pixel PIX (color pixel PXr, PXg, PXb) that structure the display panel, a circuit structure in which n-channel type transistor (that is, a transistor that has a single channel polarity) T1, T2 is applied, was described. Since only transistors of n-channel type can be applied according to this circuit structure, a transistor with stable operation property can be made easily, by using amorphous silicon semiconductor manufacturing technology that is already established. Here, transistor of luminescent driving circuit may be poly silicon TFT, other than amorphous silicon TFT. That is, it may comprise n-channel type transistor only, p-channel type transistor only, or n-channel type transistor and p-channel type transistor. In addition, number of transistor is not limited to two, and it may be structured with three or more transistors. Further, luminescent driving circuit may conduct voltage gradation control in which luminance gradation of organic EL element is controlled, or may conduct current gradation control in which current of predetermined value is applied to the luminescent driving circuit and luminance gradation of organic EL element is controlled.

What is claimed is:

1. A manufacturing method of a display device provided with a luminescent element that includes a pixel electrode, a counter electrode, and a carrier transport layer which transports a carrier between the pixel electrode and the counter electrode, the method comprising:
    forming a liquid repellent film on respective surfaces of a plurality of barrier walls provided on a substrate;
    coating a carrier transport material containing acidic solution that contains carrier transport layer material on the pixel electrode, which is arranged in between the plurality of barrier walls; and
    drying the carrier transport material containing the acidic solution under an inert gas atmosphere.

2. The manufacturing method as claimed in claim 1, wherein a liquid repellency of the liquid repellent film degrades under an atmosphere containing oxygen.

3. The manufacturing method as claimed in claim 1, wherein the liquid repellent film comprises a triazine thiol compound.

4. The manufacturing method as claimed in claim 1, wherein at least the respective surfaces of the plurality of barrier walls comprises a single metal or a metal alloy of nonoxide.

5. The manufacturing method as claimed in claim 1, wherein the plurality of barrier walls are provided in a line arrangement that directly or indirectly connects to the luminescent element.

6. The manufacturing method as claimed in claim 1, wherein the luminescent element is connected to a luminescent driving circuit that includes a transistor.

7. The manufacturing method as claimed in claim 1, wherein the pixel electrode has a surface comprising a metal oxide.

8. The manufacturing method as claimed in claim 1, wherein lyophilic processing is performed to apply a lyophilic property to the pixel electrode.

9. The manufacturing method as claimed in claim 8, wherein the lyophilic processing includes at least one of oxygen plasma processing and UV-ozone processing.

10. The manufacturing method as claimed in claim 1, wherein, when forming the liquid repellent film, the liquid repellent film is formed selectively on the respective surfaces of the plurality of barrier walls.

11. The manufacturing method as claimed in claim 1, wherein the liquid repellent film is electrically conductive in a thickness direction.

12. The manufacturing method as claimed in claim 1, further comprising forming the counter electrode, which electrically connects with the plurality of barrier walls through the liquid repellent film, after the drying.

13. The manufacturing method as claimed in claim 1, wherein the pixel electrode is reflective and the counter electrode is transparent.

14. The manufacturing method as claimed in claim 1, wherein the pixel electrode is transparent and the counter electrode is reflective.

* * * * *